US 6,539,051 B1

(12) United States Patent
Grivna

(10) Patent No.: US 6,539,051 B1
(45) Date of Patent: Mar. 25, 2003

(54) PARALLEL FRAMER AND TRANSPORT PROTOCOL WITH DISTRIBUTED FRAMING AND CONTINUOUS DATA

(75) Inventor: Edward L. Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/096,056

(22) Filed: Mar. 11, 2002

(51) Int. Cl.[7] .............................................. H04B 2/38
(52) U.S. Cl. .................. 375/219; 375/222; 375/225; 375/257; 375/265; 375/295; 375/316; 370/470; 370/474; 370/476
(58) Field of Search ..................... 341/68, 81, 100; 375/219, 222, 225, 257, 265, 295, 316; 370/470, 474, 476

(56) References Cited

U.S. PATENT DOCUMENTS

| 3,515,805 | A | * | 6/1970 | Fracassi et al. ............... 380/46 |
| 3,950,616 | A | * | 4/1976 | Tammaru ..................... 375/365 |
| 4,835,768 | A | * | 5/1989 | Hubbard et al. ............ 370/512 |
| 5,237,593 | A | * | 8/1993 | Fisher et al. ................. 375/367 |
| 5,438,621 | A | * | 8/1995 | Hornak et al. .............. 361/246 |
| 5,633,892 | A | * | 5/1997 | Krisher ......................... 341/57 |
| 5,673,266 | A | * | 9/1997 | Li ................................ 370/320 |
| 6,144,695 | A | * | 11/2000 | Helms et al. ................ 370/201 |
| 6,192,093 | B1 | * | 2/2001 | Lai et al. ..................... 375/371 |

* cited by examiner

Primary Examiner—Michael Tokar
Assistant Examiner—Khai Nguyen
(74) Attorney, Agent, or Firm—Wagner, Murabito & Hao LLP

(57) ABSTRACT

A method and system for serially communicating a stream of data characters having bit-interleaved framing information. One embodiment discloses a method for interleaving a single bit of a frame marker sequence to each data character to demarcate each of the data characters and then serializing the data. The transmitting device serially transmits the data characters with bit-interleaved framing at a high transmission bit rate, over a single communication link. The receiving device captures the data stream and de-serializes the data. It then locates the bit position of the character boundary by detecting a predetermined frame marker sequence located in the same bit position over consecutive data characters. The offset is used to frame the data. A character rate greater than 70 MHz can be realized and a bit transmission rate of greater than 1 Gbit/second can be achieved.

25 Claims, 12 Drawing Sheets

400

```
┌─────────────────────────────────────────────────┐
│ 19-BIT WIDTH DATA CHARACTERS ARE RECEIVED FROM THE│
│                     SOURCE                       │
│                      410                         │
└─────────────────────────────────────────────────┘
                         │
                         ▼
┌─────────────────────────────────────────────────┐
│  ONE FRAMING BIT IS ADDED TO EACH 19-BIT WIDTH DATA│
│  CHARACTER TO MARK THE CHARACTER BOUNDARY, MAKING IT│
│     20-BITS WIDE (AN INTEGER MULTIPLE OF 10 BITS)│
│                      420                         │
└─────────────────────────────────────────────────┘
                         │
                         ▼
┌─────────────────────────────────────────────────┐
│   THE 20-BIT CHARACTER IS PASSED THROUGH A PARALLEL│
│   SCRAMBLER WHICH APPLIES THE SCRAMBLER POLYNOMIAL│
│              G₁ (X) = X⁹ + X⁴ + 1                │
│                      430                         │
└─────────────────────────────────────────────────┘
                         │
                         ▼
┌─────────────────────────────────────────────────┐
│   THE SCRAMBLED CHARACTER IS PASSED THROUGH AN NRZI│
│             ENCODED USING THE POLYNOMIAL         │
│                  G₂ (X) = X + 1                  │
│            TO MAKE IT POLARITY INSENSITIVE       │
│                      440                         │
└─────────────────────────────────────────────────┘
                         │
                         ▼
┌─────────────────────────────────────────────────┐
│  HALF (10-BITS) OF EACH NRZI ENCODED CHARACTER ARE│
│   PASSED TO THE SERIALIZER ON EACH HALF OF THE 70 MHz│
│                   CLOCK PERIOD                   │
│                      450                         │
└─────────────────────────────────────────────────┘
                         │
                         ▼
┌─────────────────────────────────────────────────┐
│   10-BIT GROUPS ARE SERIALIZED AND OUTPUT AT A SIGNALING│
│   RATE 20 TIMES THE 70 MHz CLOCK RATE OR 1.4 GBITS/SECOND│
│                      460                         │
└─────────────────────────────────────────────────┘
```

Step 430: $G_1(X) = X^9 + X^4 + 1$

Step 440: $G_2(X) = X + 1$

FIGURE 4

PARALLEL FRAMER AND TRANSPORT PROTOCOL WITH DISTRIBUTED FRAMING AND CONTINUOUS DATA

FIELD OF INVENTION

The present invention relates to the field of data communication. More specifically an embodiment of the present invention relates to the field of serially transmitting framing information bit-interleaved with data characters.

BACKGROUND OF THE INVENTION

Bit interleaved framing has been used in data communication in the past. It is used in PDH (Plesiochronous Digital Hierarchy) in normal voice level telecommunication. Telephone companies used bit interleaving in their T1 and T3 modes of operation. In a T3 line, a transmitter inserts framing bits at fixed locations in the data stream; e.g. one every 171 bits according to a pre-determined sequence of bits. At the receive end, the receiving device looks at one bit in the data stream and waits 170 bits and looks at the same bit location in the data stream again and repeats the process for several times. Each examined bit is compared for a match with the pre-determined sequence of framing bits. From the framing bits, a frame boundary is determined and individual bytes are taken out of the data stream. The framing bits give the boundary of the data transmitted.

The telephone companies, however, abandoned this method of framing when high-speed transmission, e.g., in excess of 45 Mbits/second, was required. At data rates faster than T3, voice and data are transmitted with SONET protocols which use character-based framing. SONET protocols are used for data rates greater than 51 Mbits/second. In SONET protocols, a sequence of framing characters is used to mark the frame boundaries. At the receiving end, detection of the sequence of framing characters provides the frame boundary.

However, character-based framing has its disadvantages. One disadvantage being that character-framing demarcation leaves gaps in time between data information characters. Gaps between a group of data information characters are not tolerated in certain types of data transmission. For example, in Radio Frequency (RF) communication where constant direct modulation is required (e.g., I/Q modulation), modulation cannot be stopped for even a brief period of time. Gaps in modulation caused by the presence of framing characters in the modulation vector stream are not tolerated. Therefore, a need exists for a method of sending framing information, for a character-oriented data stream operated faster than T3 rates, in a form that avoids the generation of gaps in the delivered character stream caused by the framing information.

Wireless (radio-frequency) cellular telecommunication generally uses several transmitting antennas, with each transmitter generating a signal consisting of both in-phase and quadrature modulation components. These modulation components are generally delivered to the transmitter as 19-bit binary symbols which are used as inputs to digital-to-analog (D/A) converters. In one example these signals may be provided to each transmitter across a 19-bit wide parallel path, with said path consisting of 18 bits of data and a parity bit, with new symbols provided continuously at a 70-MHz rate. The data throughput required for this example interface exceeds 1 Gbit/second.

As shown in FIG. 1A, parallel interfaces have generally been used to provide high-speed communication of data. FIG. 1A depicts a conventional communication system 180 for transmitting 19-bit source data. This conventional system sends data across a parallel data bus along with a clock. One implementation uses a 19-bit parallel bus for each of the data paths along with a 70-MHz clock. These signals are routed on a backplane between the source card and a digital to analog (D/A) card. Each source card presents six of these 19-bit buses which results in a high signal density on the backplane and its associated connectors. The wire density on the backplane is especially high when eight of these source cards are required for transmission. This requires the partitioning of the system based on the limitations of the backpanel and its connectors. In addition, the signals on these buses must also be sent with their associated clock, while maintaining skew control between all signals and their associated clock.

In parallel transmission systems, multiple signals are required to carry data from encoder cards to transmitter cards. The transfer of data is done across the backplane, as described in the previous text, and the multiple signals required for such transfer of data consume significant backplane resources. Specifically, if the cellular telecommunication supports a wide array of present and legacy communications standards, requiring separate sets of links for each standard, it will be very difficult to accommodate the extra links due to the limited routing resources and congestion on the backpanel. Therefore, a need exists for data transmission in excess of 1 Gbit/second without gaps in the stream of data transferred and without the use of a parallel-bus backplane.

FIG. 1B illustrates an improved communication system 190. To improve the method, the parallel bus of FIG. 1A was replaced with a set of LVDS (Low Voltage Differential Signaling) based serial links. Standard LVDS devices can accept and communicate parallel buses of 24-bits in width including a clock across four differential signal paths. The data is sent on several separate serial data streams, each carrying a subset of the total number of bits, along with a separate signal for the clock. According to this improved method, data is only serialized and not scrambled or encoded.

Therefore, the data is sent on several separate data streams, each serializing a number of bits, along with a separate link for the clock.

A disadvantage associated with the previous methods is that the multiple signals that make each communication channel (parallel or multiple LVDS serial) have to be delay matched, i.e., they have to be measured to the same electrical length. This is due to the fact that at the receiving end, data recovery is relative to the clock time reference received on one of the LVDS signals. If any signal path is slightly longer than the other, the receiving end samples the bits at the wrong place. Therefore, a slight difference in length between these four differential pairs may disturb the integrity of the data information captured at the receiving end.

Another disadvantage associated with the conventional methods is that because the data is not encoded or scrambled, it must be carried through a DC-coupled interface. This requires that the transmitter and receiver be coupled to a common signal ground reference, and often to a common power supply. This lack of encoding or scrambling also maximizes the inter-symbol interference between bits on the serial links. If the transmission is to occur over a significant distance; e.g., >10 m, the links will not operate. These conventional methods require several signals, are subject to increased inter-symbol interference and are limited to operation distances of less than 10 m.

SUMMARY OF THE INVENTION

Therefore, a need exists for a method to a) transfer character-oriented data at high speed and without gaps in the stream of data, b) decrease the number of signals needed to transfer said data on or across a backplane, and c) reduce the inter-symbol interference of the data being sent, d) while allowing operation distances greater than 10 m.

Accordingly, embodiments of the present invention concern a method, system, architecture, and circuitry for high-speed serial character-based data transmission using bit-interleaved framing, enabling the elimination of gaps in the stream of data characters during the transmission. Transmission of data characters over a serial link (e.g., a differential pair) reduces the number of signals on the backplane required to transmit this data relative to a parallel architecture. The use of a single link also eliminates any channel-to-channel signal skew requirements. This allows the maximum link length to be determined by the ability of the link receiver to resolve a signal, instead of the ability to maintain matched delays across multiple signals. Embodiments of the present invention allow data encoding and scrambling thereby reducing inter-symbol interference and allowing the serial link to be AC- or DC-coupled. Embodiments may also use optical transmission links, balanced or unbalanced transmission lines, or circuit board transmission-line constructs. In another embodiment, NRZI encoding allows the true and complement signals to be connected without regard to the active state.

These and other objects and advantages of the present invention will no doubt become obvious to those of ordinary skill in the art after having read the following detailed description which is illustrated in the following text and associated figures.

A method and system are described for serially communicating a character-based data stream, using bit-interleaved framing information, from a transmitting device to a receiving device. In one embodiment, the present invention concerns a method and system for interleaving a single bit of a framing-bit sequence to each of the plurality of data characters to demark each of the data characters. The receiving device-captures and extracts the plurality of data characters serially transmitted by the transmitting device with bit-interleaved framing bits.

In another embodiment, the transmitting device serially transmits the data characters with bit-interleaved framing bits at an integer multiple of the rate at which they are input to the transmitting device without gaps between consecutive characters.

In yet another embodiment, a receiving device captures the serial bit stream generated by the transmitter, and automatically determines the character boundaries when a predefined number or pattern of framing bits is found in consecutive received characters. In this embodiment, the position of the framing-bits in the character stream is located and/or determined, and an offset location of the data characters is sent to a barrel shifter (multiplexer) which recaptures the data character and all following data characters.

More specifically, the present invention concerns a high-speed communications link with character-oriented distributed framing. The transmitting device receives a character-based data stream from a data source, said data stream consisting of a plurality of multi-bit data characters. Bit-interleaved framing adds one or more bits (that may be generated by a framing-bit generator) to each of the plurality of data characters, marking the boundary of each of the plurality of data characters. The transmitting device serially transmits the stream of multi-bit data characters at a transmission rate that is an integer multiple of the input character rate. The receiving device captures the stream of multi-bit data characters, which was serially transmitted by the transmitting device. The receiving device locates the frame marker pattern, interleaved between the data characters, and recovers the plurality of multi-bit data characters.

In one embodiment, the data characters of the data stream arrive at the transmitting device in parallel and are n-bits in length. A respective framing bit is added to each. The (n+1)-bit result is fed to a parallel scrambler and then to a NRZI encoder. A serializer then serializes the (n+1)-bit data and the serial result is then transmitted over a serial communication link at a high signaling rate. The framing bit added to each input character is part of a framing sequence which is a predetermined sequence or pattern. Advantageously, the transmitted character-based data stream (using bit-interleaved framing information) is continuous, e.g., it does not contain any gaps in the character data.

In one embodiment, the receiving device of the present invention captures the character-based data stream (containing bit-interleaved framing information) from the communication link and deserializes the data into a parallel format. The parallel data is then decoded (e.g., NRZI decoded) and then descrambled. The parallel output of the descrambler is fed to a plurality of pipeline registers which are coupled to a framing detection logic circuit. The pipeline registers can store more than n-bits of character and framing data.

The framing detection logic circuit of the present invention examines each bit of the received data for the predetermined framing pattern. In one embodiment, the detection logic contains a detection circuit and state machine for each bit position of the character (inclusive of framing bits) to perform the examination. Each instance of the detection circuit and state machine is used to track the status of pattern matches at one of the (n+1) possible bit locations. This pattern can be observed after a predetermined number of characters have been received. Once a pattern match is found by one or more of said state machines, a signal is sent to a second circuit that checks for the presence of a "one-and-only-one" pattern match to determine the bit location of the framing pattern.

Once the bit location of the framing pattern is known, it remains at the same bit location for all characters received thereafter. Therefore, the known location of the framing bit is presented to a barrel shifter to set the proper character boundaries of the data character which may be spread across the plurality of pipeline registers. In other words, the output of the match detection logic is used to update the barrel-shifter with the proper offset of the n-bit character (plus framing bit) within the data stream. The obtained characters are then output in parallel format. The comparator also drives an output parity control signal to indicate bad parity until framing is discovered.

BRIEF DESCRIPTION OF THE DRAWINGS

The accompanying drawings, which are incorporated in and form a part of this specification, illustrate embodiment of the invention and, together with the description, serve to explain the principles of the invention:

FIG. 4 is a flowchart of the steps in a process for interleaving the stream of bits of the framing-bit sequence with the stream of data characters and serially transmitting a single stream of data characters, as performed by the transmitter device of FIG. 3A.

DETAILED DESCRIPTION OF THE PREFERRED EMBODIMENTS

Figure 1A:
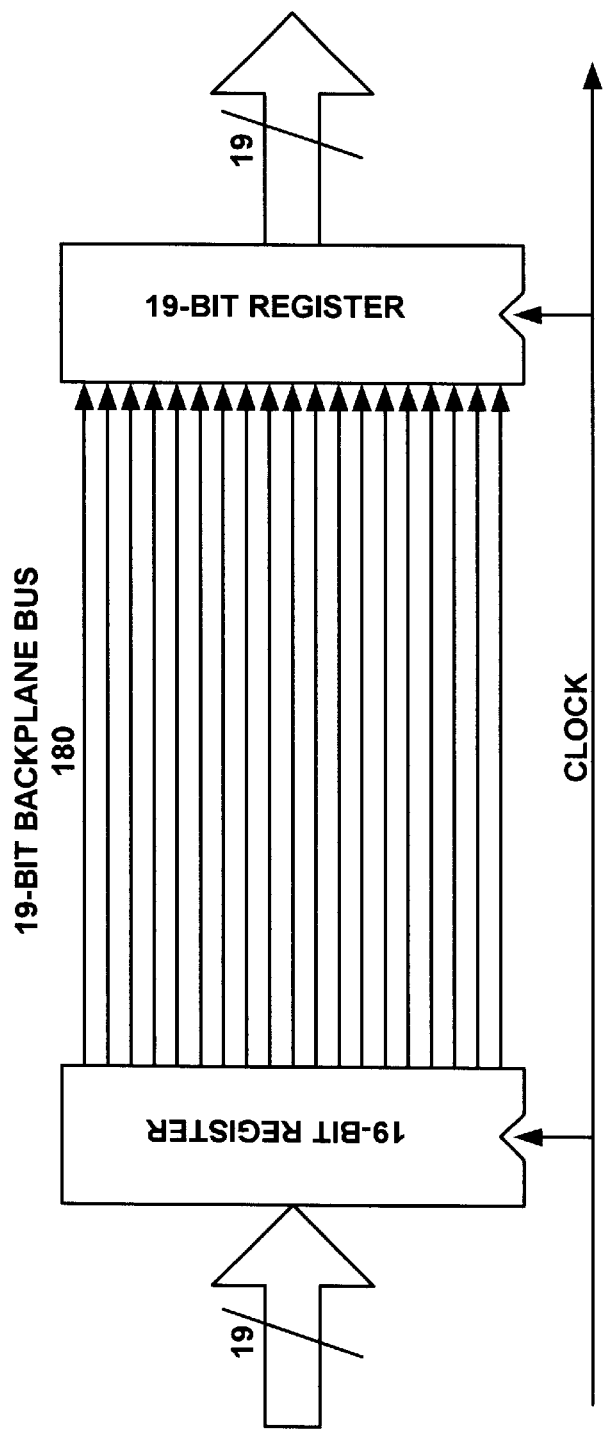
FIG. 1A depicts the method using transmission of data with a 19-bit parallel bus and clock across a backplane.
Figure 1B:
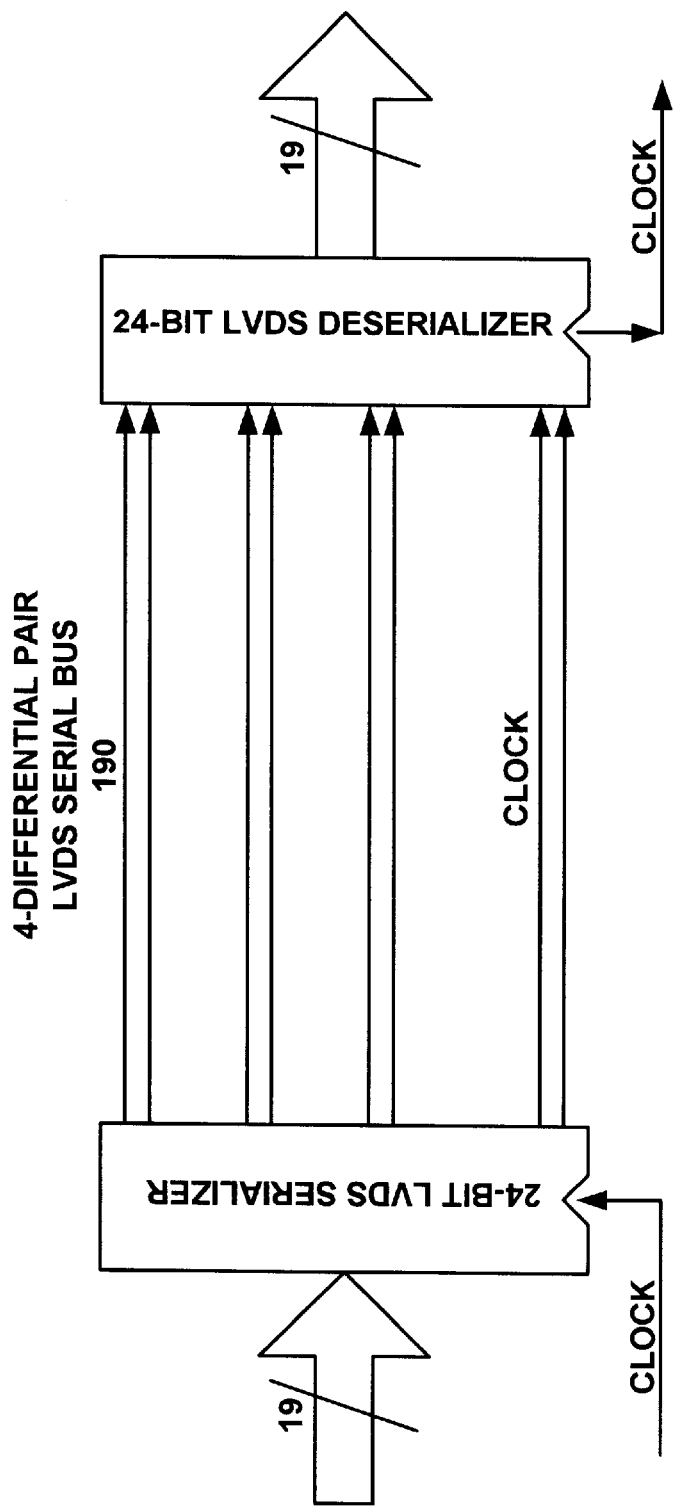
FIG. 1B depicts an improved method of the transmission described in FIG. 1A, using multiple LVDS serial links in parallel, reducing the backplane signal density.
Figure 2:
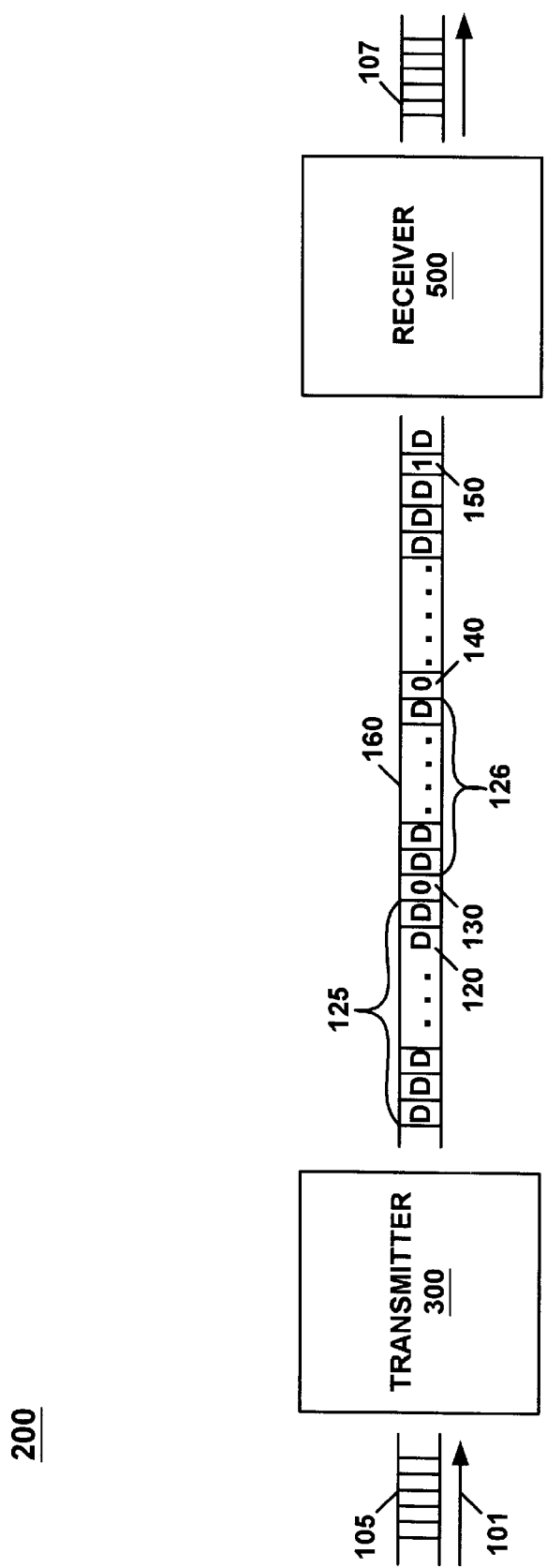
FIG. 2 is an exemplary diagram of the serial transmission of a stream of data characters with framing bits interleaved between data characters.

FIG. 2 is an exemplary diagram of the transmission of a stream of serial data composed of individual data characters with framing bits interleaved there between, e.g., interleaved with the data, (hereinafter "bit-interleave framed characters") as used in accordance with embodiments of the present invention. Regarding FIG. 2 (and FIG. 3B), the bit stream is shown with scrambling and encoding removed for clarity. In reality, the data on these streams resembles almost random data. Without processing through the decoder and the descrambler (discussed in the following text), it is not possible to identify the bits of the framing-bit sequence.

As shown in FIG. 2, transmitter 300 receives a stream of characters 105 from a data source. The source may supply the input data in parallel form at a first character rate. The input data characters are n-bits in length. The transmitter 300 adds a frame marker bit, e.g., 130, 140, or 150, to each data character and serializes the resultant data. Using a bit-interleaved method, the transmitter 300 transmits the data characters with bit interleaved framing information 160 over a high speed serial communication link to receiver 500. The serial communication of the character-based data stream (using bit-interleaved framing information) 160 is performed at a very high bit rate (e.g., greater than 1330 Mbits/second) and this high bit rate can be much higher than the input character rate. Frame marker bit 130 is separated from frame marker bit 140 by n-bits of character data 126, as are all frame marker bits of serial data stream 160.

Receiver 500 receives the transmitted serial data stream (containing bit-interleaved framing information), converts the serial data into a parallel format and locates the position of the bit-length frame markers 130, 140, and 150. Receiver 500 then recaptures the transmitted data characters 105 and delivers this stream of characters 107 to the destination.

Figure 3A:
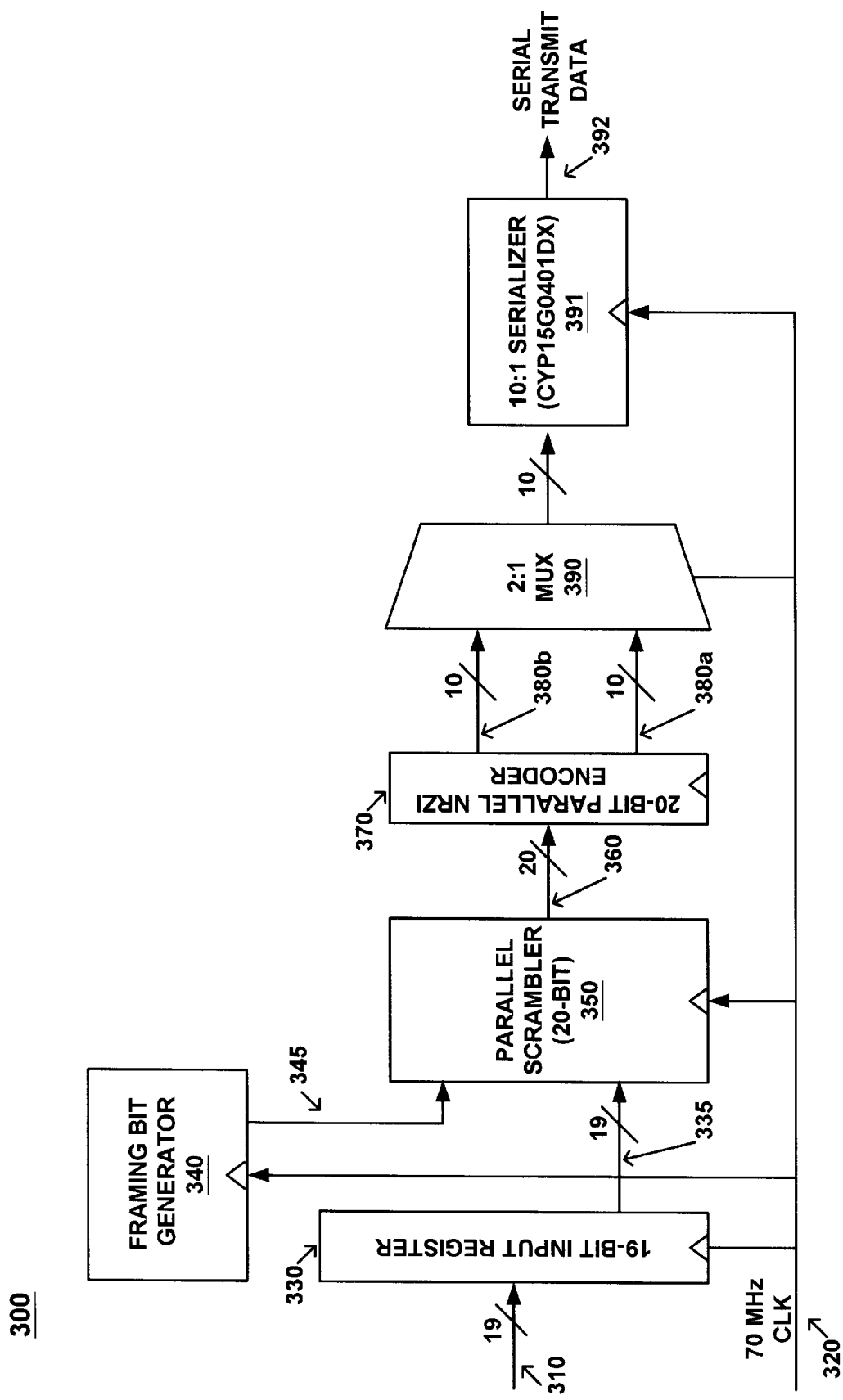
FIG. 3A is a block diagram of a transmitter device for transmitting character-based data streams with bit-interleaved framing as a serial transmit stream in accordance with an embodiment of the present invention.

FIG. 3A is a block diagram of an embodiment of transmitter 300 of the present invention which uses a single communication channel to serially transmit a character-based data stream (using bit-interleaved framing information) at a high bit rate, e.g., over 1 Gbit/second. More specifically, input register 330 receives an n-bit data character from the data source 310 along with a clock signal 320. In one embodiment, n=19 and the clock frequency is 70 MHz. A parallel scrambler 350, e.g., SMPTE (Society of Motion Picture and Television Engineers) type, receives a single bit frame marker 345 from framing bit generator 340 and the n-bit output from the input register 330.

The parallel scrambler 350 combines said frame marker bit (of frame sequence 345) with the n-bit data character 335 at an arbitrary but fixed bit position, which can be considered as a (n+1)-bit data group having a character and a framing bit. This (n+1)-bit data group is then merged with a scrambler polynomial to increase the transition density of the data group, resulting in parallel scrambled data 360.

A separate frame marker bit from sequence 345 is added for each received character. It is appreciated that the injected frame marker bits follow a predetermined sequence or pattern of bits that is unlikely to occur continuously in the bits of the character data. In one embodiment, said pattern is "00110011001100110011 . . . ." The frame marker bits of sequence 345 can be sequenced into an arbitrary position within each n-bit data character; however, each consecutive frame marker is always separated from the next by a width of n-bits.

Regarding FIG. 3A, scrambled (n+1)-bit character data groups 360 are then passed through (n+1)-bit parallel NRZI encoder 370 to add NRZI encoding to the data making, in one embodiment, two multi-bit results, 380a and 380b, which, when passed through a serial communications link, are insensitive to the true or complement state of the serial transmit data. In the general case, each data group is (n+1)/2 in length, but one group of size (n+1) bit could also be output from encoder 370. Data groups 380a and 380b are then passed LSB first through multiplexer 390. Multiplexer (MUX) 390 outputs data groups 380a and 380b one at a time. On the first half of each 70-MHz clock cycle 320 the lower-order 10-bit output 380a of NRZI encoder 370 is passed through multiplexer 390. On the second half of each 70-MHz clock cycle the high-order 10-bit output 380b of NRZI encoder 370 is passed through multiplexer 390.

Data groups 380a and 380b are passed, in the sequence received from multiplexer 390, through a serializer 391 forming a serial data stream (serial transmit data) 392 having character and framing bit information, e.g., a transmitted character-based data stream (containing bit-interleaved framing information). In the exemplary case where n=19 and two data groups are used, the serializer 391 is a 10:1 serializer. Data stream 392 is characterized in that it is insensitive to charge-discharge in transmission, insensitive to true or complement state, and may be transmitted with a serial transmission rate of 1400 Mbits/second (or higher) over a single communication channel, e.g., optical, balanced or unbalanced transmission lines, circuit board transmission-line constructs, etc.

The data fed to the scrambler 350, and subsequently to NRZI encoder 370, can be sequenced in two halves in order to reduce the complexity of the hardware required to implement the scrambler algorithm and NRZI encoder. When the data is sequenced, the parallel scrambler and NRZI encoder become significantly smaller in size, e.g., fewer hardware resources are required, but must be clocked twice as fast, e.g., 140 MHz assuming an input character rate of 70 MHz. This explains the use of the two data groups 380a and 380b.

If implemented with this faster clock, the multiplexer 390 would be removed from the data path, and the output 380 of the NRZI encoder 380 would connect directly to the serializer 391. An alternate 2:1 multiplexer function would then be required to sequence the n+1 bits of the pipelined data stream 335 and the framing bit sequence 345 into the reduced complexity parallel scrambler 350.

Any of a number of scrambler polynomials can be used to implement the scrambler function, but in one embodiment the polynomial is:

$$G(x) = x^9 + x^4 + 1$$

which is commonly used for professional video transport, as documented in SMPTE standard 259M which is hereby incorporated by reference in its entirety.

Figure 3B:
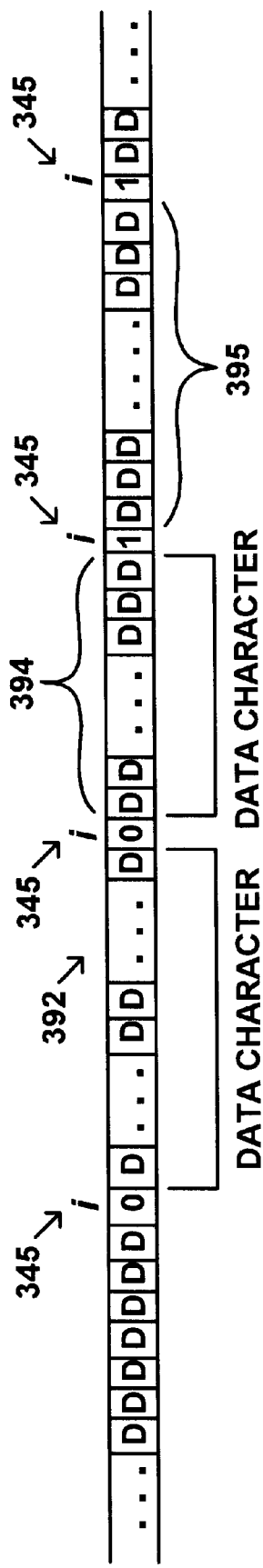
FIG. 3B is an exemplary diagram of a stream of data characters with interleaved bits of the framing-bit sequence, transmitted as a serial bit-stream by the transmitting device of FIG. 3A.

FIG. 3B is an exemplary depiction of a transmitted character-based data stream 392 (containing bit-interleaved framing information), output from the transmitter 300 of FIG. 3A (shown here without scrambling and encoding). The transmitted character-based data stream (containing bit-interleaved framing information) 392 of FIG. 3B includes a number of frame marker bits 345 in accordance with a pre-defined framing sequence or pattern. Frame markers 345 are used to bound a character of data. One frame marker bit 345 is added to each data character 395 in a bit location "i". Location "i" is an arbitrary location; however, its position within the character must be know by both the transmitter 300 and receiver 500 to allow proper extraction of the transmitted data characters by the receiver. Two consecutive frame markers are always separated from one another by a character width of serial data 394, 395.

FIG. 4 is a flowchart of the steps in a process 400 performed by the transmitter 300 in accordance with an embodiment of the present invention for generating and transmitting the source character-based data stream (containing bit-interleaved framing information). In the present embodiment, the data character used is a 19-bit data character, but may be any length. It is appreciated that process 400 can also be implemented using a stream of data including any multi-bit characters, and also the frame markers can be taken from any predefined number and predefined sequence of binary patterns ("framing pattern") which are unlikely to occur continuously in the stream of data characters.

In one embodiment of the present invention, a one-bit frame marker is added in the same bit location to each of the multi-bit data characters received from a data source. The particular location of the added bit is arbitrary; however, the separation of two consecutive frame markers is always one data character in width in the generated serial bit stream.

In step 410 of FIG. 4, with reference also to FIG. 3A and FIG. 3B, the 19-bit width characters are received from a source along with a clock signal at 70 MHz, in one embodiment. The clock could be of any frequency.

In step 420 of FIG. 4, one framing bit from the framing pattern is added to each 19-bit width data character, making it 20 bits, which is a 10-bit multiple and contains the marker for character boundary determination. This implementation anticipates the use of a 10:1 serializer which are commonly available.

In step 430, the 20-bit width data character is passed through the parallel scrambler, applying polynomial $G_1(X) = X^9 + X^4 + 1$, to generate a scrambled 20-bit data group. Alternatively, two 10-bit data groups could be generated.

In step 440, application of polynomial $G_2(X) = X+1$ adds NRZI encoding to the 20-bit data groups output from the scrambler making the data polarity insensitive in the serial domain.

In step 450, the 20-bit data groups are passed through a serializer. In one embodiment, a 10:1 serializer can be used and two halves of each 20-bit data group are sequentially loaded at 140 MHz. However, if used with alternate physical layer devices supporting a 20-bit parallel interface, the 20-bit data groups could be loaded at 70 MHz. The serial data is then output over the serial communication channel at 20 times the source character rate of 70 MHz or 1.4 Gbits/second. In the general case, if the input data is n-bits in size and the added framing information is m-bits in size, then the output serial bit rate will be (n+m) times the input character rate.

Therefore, the transmitted character-based data stream (using bit-interleaved framing information) is scrambled and transmitted by device 300 using a single serial link. The scrambled serial data with bit-interleaved framing may be transmitted through a number of available transmission mediums, e.g., optical fiber, balanced or unbalanced transmission lines, circuit board transmission-line constructs, etc. The serial data stream with bit-interleaved framing responds to the telecommunication industry's requirements for a high rate data character transmission mechanism without gaps in the data stream. Furthermore, the present invention eliminates the requirement for skew control between serial links because only a single communication link is used. Because the scrambled and NRZI encoded signaling contains no long-term DC content, the transmission can be maintained across devices of different power and ground domains.

Figure 5:
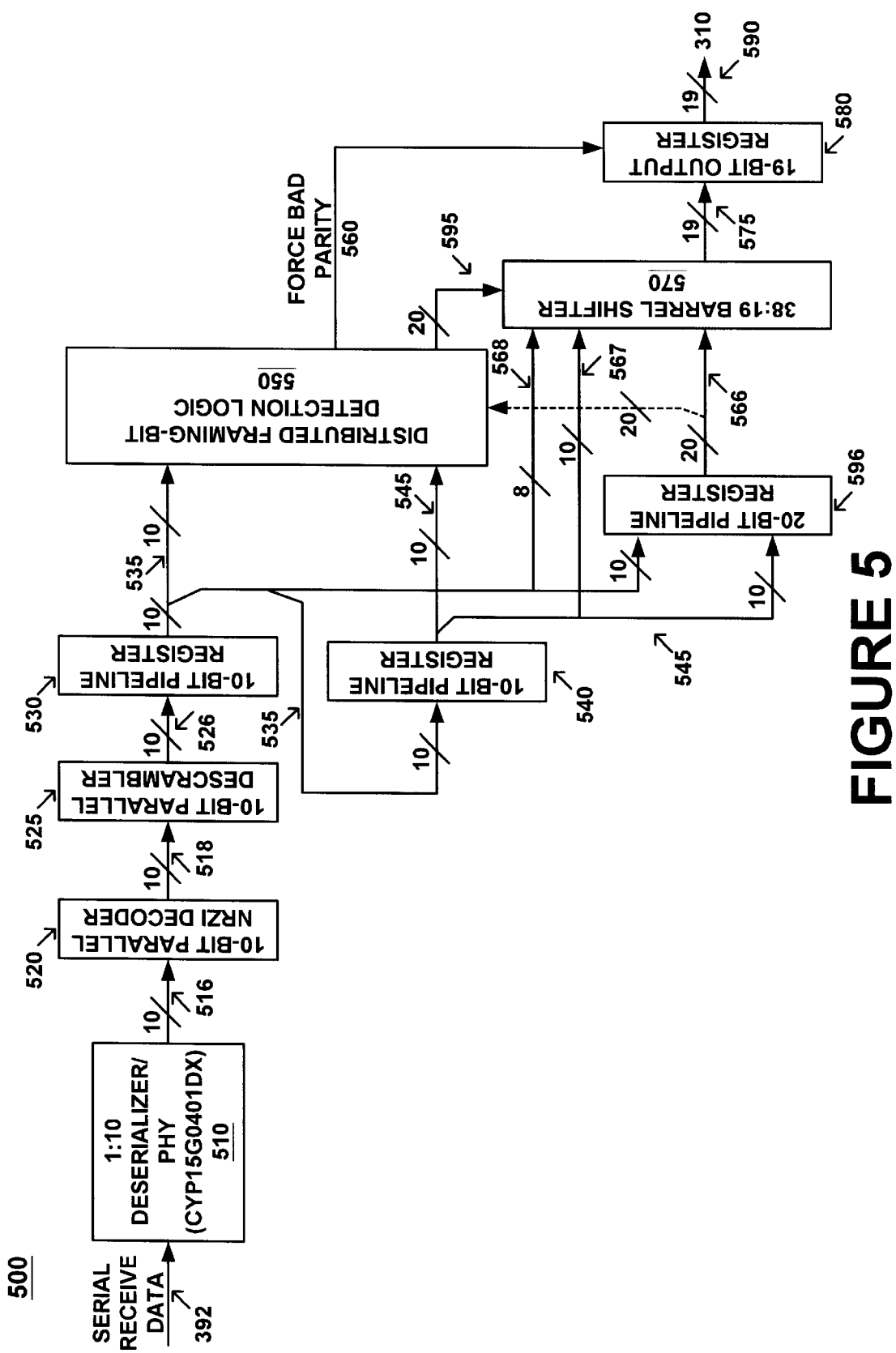
FIG. 5 is a block diagram of a receiver device for detecting a sequence of framing bits distributed periodically throughout a serial data stream, and extracting the data characters in said data stream in accordance with an embodiment of the present invention.

FIG. 5 is a block diagram of an embodiment of the receiving device 500, which receives the serially transmitted data stream with bit interleaved framing 392 which is transmitted with a transmission bit rate in excess of 1 Gbit/second, in one example. Within the receiving device 500, the present invention discloses a method and a system for detecting the location of the frame marker bits, determining character boundaries therefrom and recapturing the data characters.

Generally, the receiving device 500 receives a serial data stream with bit interleaved framing 392 and includes a deserializer, which converts the high-speed serial stream 392 into a stream of multi-bit parallel groups. This stream of multi-bit groups is then is passed through an NRZI decoder, reversing the NRZI effect on the data added by transmitter 300. Then a descrambler descrambles the stream of multi-bit groups and readies the data for framing. The descrambled result is stored in a plurality of pipeline registers.

The receiving device includes a Distributed Framing Bit Detection Logic (DFBDL) block 550 that is used to determine the location of the frame marker bits within the pipeline registers. Once the location is determined, the character boundary is discovered, and the characters can be recovered from the pipeline registers.

More specifically, receiver 500 receives the data stream 392 of FIG. 3A. A clock and data recovery (CDR) is performed by a PLL (Phase Locked Loop) which extracts a bit-rate clock from the transitions in the data stream and uses that clock to sample the signal presented to the serial line receiver input to the deserializer. These samples are bits recovered or extracted from the received signal. The received bits are formed into groups by the deserializer 510. In one embodiment, deserializer 510 transforms the serial data stream 392 of FIG. 3A into a continuous stream of 10-bit groups 516. The stream of 10-bit data groups 516 are passed through 10-bit parallel NRZI to NRZ decoder 520 to remove the NRZI encoding, producing a continuous stream of decoded 10-bit groups 518.

NRZI Decoded 10-bit data groups 518 are then passed through descrambler 525, thereby removing transitions added by the scrambler polynomial 350 of FIG. 3A. This produces a continuous stream of decoded and descrambled 10-bit groups 526. The decoder and descrambler units can be implemented using well known circuits and processes. Regarding circuits 510, 520, 525, and 530, a 20-bit bus could also be used provided the physical circuitry supports the wider bus. When operating at the 10-bit size, circuits 510, 520, 525, and 530 operate at twice the 20-bit character recapture rate.

Referring still to FIG. 5, in the present embodiment, pipeline registers 530 and 540 latch consecutive 10-bit groups of data 526, and presents same as 535 and 545. These two 10-bit groups 535 and 545 are supplied to the Distributing Framing-Bit Detection Logic (DFBDL) block 550. Alternatively, 10-bit pipeline registers 530 and 540 could be combined into a single 20-bit register. The outputs 535 and 545 of pipeline registers 530 and 540 also couple directly to the input of 20-bit pipeline register 596, producing a copy of the same data contained in 10-bit pipeline registers 530 and 540, delayed in time by 20 bit periods (one source character time), and presented as signal 566.

DFBDL block 550 determines the bit location of the framing marker bit sequence. In order to do this, the DFBDL 550 includes a number of framing sequence detection logic blocks ("state machines") equal to the number of bits (n+1) in the source data character plus the bit-interleaved framing bit. Each instance of the sequence detection state machine included in the DFBDL 550, is coupled to one bit location of the 10-bit pipeline registers 530 or 540, and one bit of the 20-bit pipeline register 596. This sequence detection logic block continuously tests every position of each multi-bit character for the presence of the frame marker bit sequence.

The DFDBL block 550, as well as the 20-bit pipeline register 596, barrel shifter mux 570, and 19-bit output register 580, generally operate at the 70 MHz character rate. While this DFBDL operation can be done in the 10-bit group domain by interleaving the compare outputs through additional pipeline registers within the DFBDL block, there is generally no significant advantage to do so. The logic saved by implementing half the number of sequence detection state machines is gained again by requiring additional registers to store the intermediate compare, history, and count status. In addition, since this circuitry would all operate on 10-bit groups, it would have to perform at the faster 140 MHz clock frequency, where it will generally consume more power.

As soon as any one of the sequence detection state machines detects a frame marker sequence, a Sequence Match signal is generated by that sequence detection state machine. Each state machine instance continuously tests every bit associated with its bit position for the continued presence of the frame marker sequence, and couples a Match Status signal to a respective counter and control logic within the sequence detection state machine. If a sequence match has not yet been found, and the Match Status signal is not asserted (due to the detection of a mismatch in a bit of the framing sequence), the control logic resets the counter. If a counter counts to a predefined number, it asserts a Terminal count status signal to the control logic block within the state machine. If none, or more than one, of the counters has reached this predefined number, as indicated by the One Pattern Match signal from the comparator remaining deasserted, the control logic asserts its Sequence Match signal to the comparator. It is appreciated that the counting function may be done by the state machine control logic, by counter logic controlled by the state machine control logic, or by individual states within the sequence detection state machine.

Once each character time, the comparator tests the Sequence Match status signal output of all (n+1) sequence detection state machine instances. If a Sequence Match status signal is received asserted from only one state machine instance, then the character frame boundary is found. If no Sequence Match status signals are received asserted, or if more than one such status signal is received asserted, then the character frame boundary is not found. The process of detecting the character frame boundary is repeated for each received character time.

Because the sequence of bits (transmitted on consecutive characters) used to identify the character boundaries may also exist normally over short periods of time within the stream of data characters, it is necessary to wait until the framing detection hardware 550 has resolved down to only one valid offset location before declaring that framing has been achieved. During this period, when framing is not yet valid, the DFBDL block 550 asserts a force bad parity signal 560 to the output register 580. When this signal is asserted, external bus 590 is presented with a 19-bit character having invalid parity to indicate that the information on the external bus is not valid.

However, once the DFBDL 550 block locates the offset location of the frame marker within the pipeline registers, it sends a vector address over bus 595 (using one-hot encoding) describing the offset location of the data characters to a 38:19 barrel shifter 570. Alternatively, the vector address may be passed as a binary weighted address. While this allows implementation of vector address bus 595 with fewer signals, it also requires the addition of a vector address encoder in the comparator logic of the DFBDL 550.

Vector address 595 directs the barrel shifter 570 to select a 19-bit subset of the 38-bit input bus (566, 567 and 568) and present 19-bit character-aligned data 575 to the output register 580. The inputs to barrel shifter 570 are coupled to the output of pipeline registers 530, 540, and 596. Barrel shifter 570 extracts the character data contained within pipeline registers 530, 540, and 596, based on the character boundary information represented by the frame marker offset on bus 595. The recovered character 575 is supplied to 19-bit output register 580. The character data is presented at a rate equal to the received bit rate divided by 20, in this example, which is a reconstructed copy of the source 70 MHz clock 320 shown in FIG. 3A.

Once framing has been resolved to one location, as indicated by the comparator in the DFBDL asserting an internal One Pattern Match signal, if any bit errors are detected in the framing-bit location, the character containing the error is presented on the external interface with invalid parity. If a significant number of characters are detected with invalid framing, then framing is marked as invalid and the DFBDL block must again locate the 20-bit character boundary.

Figure 6:
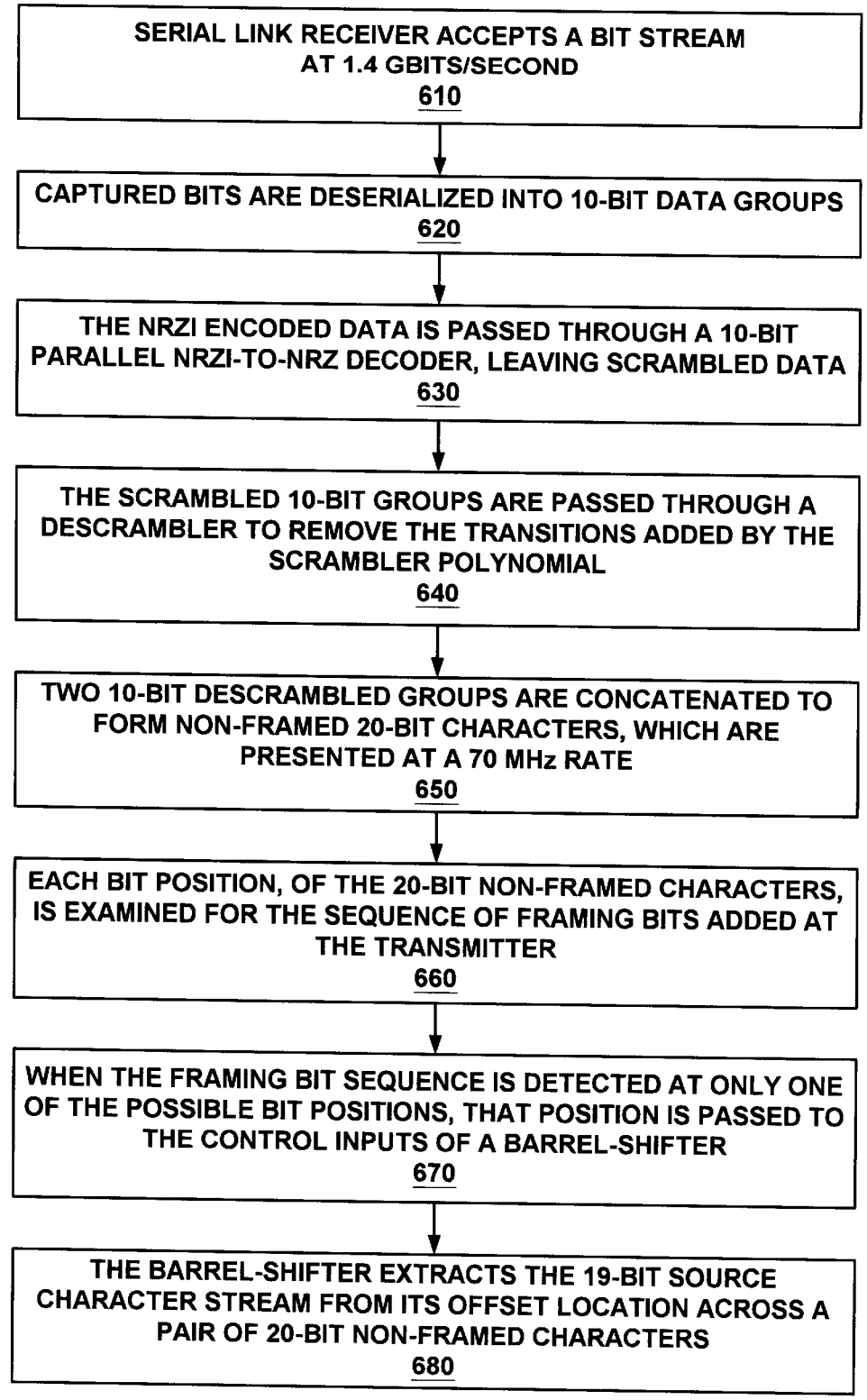
FIG. 6 is a flowchart of the steps in a process of receiving the serial bit-stream, detecting data character boundaries and recapturing data characters, as performed by the receiver device of FIG. 5.

FIG. 6 is a flowchart of the steps in a process 600 for receiving serially transmitted data characters with bit-interleaved framing in accordance with one embodiment of the present invention. In the present embodiment, the data character used is a 20-bit character. In step 610 of FIG. 6, with reference also to FIG. 5, a data stream is received with a data rate of 1400 Mbits/second.

In step 620 of FIG. 6, the stream of data is passed through a deserializer, forming 10-bit data groups. In step 630, the 10-bit data groups are passed through a NRZI-to-NRZ decoder, removing encoding added at the transmitter end. In step 640, the 10-bit data groups are descrambled, removing transitions added by a matching scrambler polynomial at the transmitter end.

In step 650, pairs of the 10-bit descrambled data groups, output from step 640, are concatenated into a 20-bit non-framed character. In step 660, each position of the non-framed 20-bit character is examined by the framing detector hardware, to locate the frame marker added before transmission. In step 670, all the sequence detectors are compared to ensure that only one is reporting valid detection of the framing sequence. When only one sequence detector is reporting detection of the framing sequence, it passes the position of the data character boundary to the barrel shifter. In step 680, the frame marker position is used to recover a 19-bit character which is captured and supplied at the character rate, e.g., 70 MHz, over the external bus.

Figure 7:
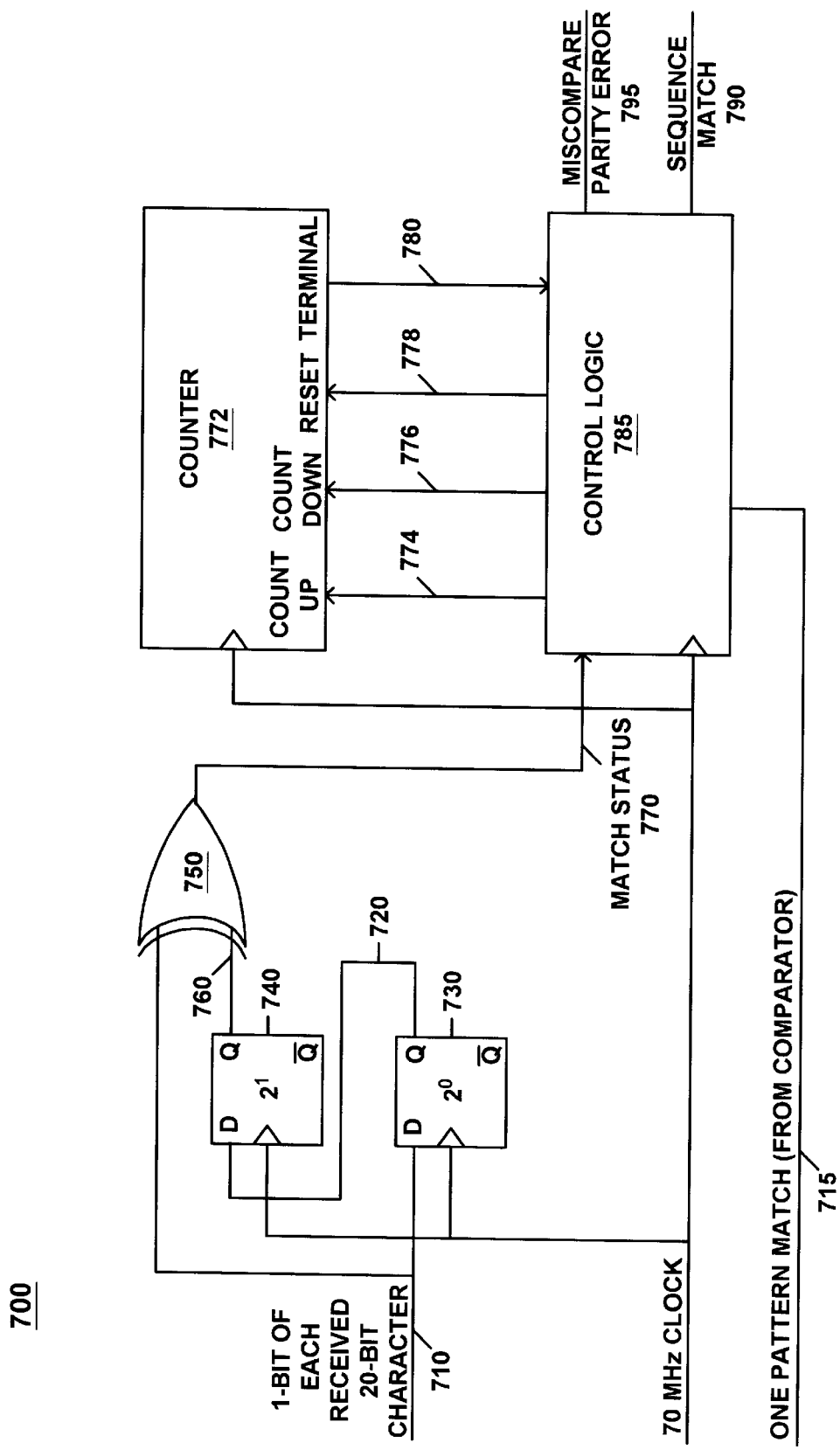
FIG. 7 depicts one of a plurality of sequence detection logic blocks, used to detect the presence or absence of the framing-bit sequence for the purpose of detecting the character boundary at the receiver.
Figure 8:
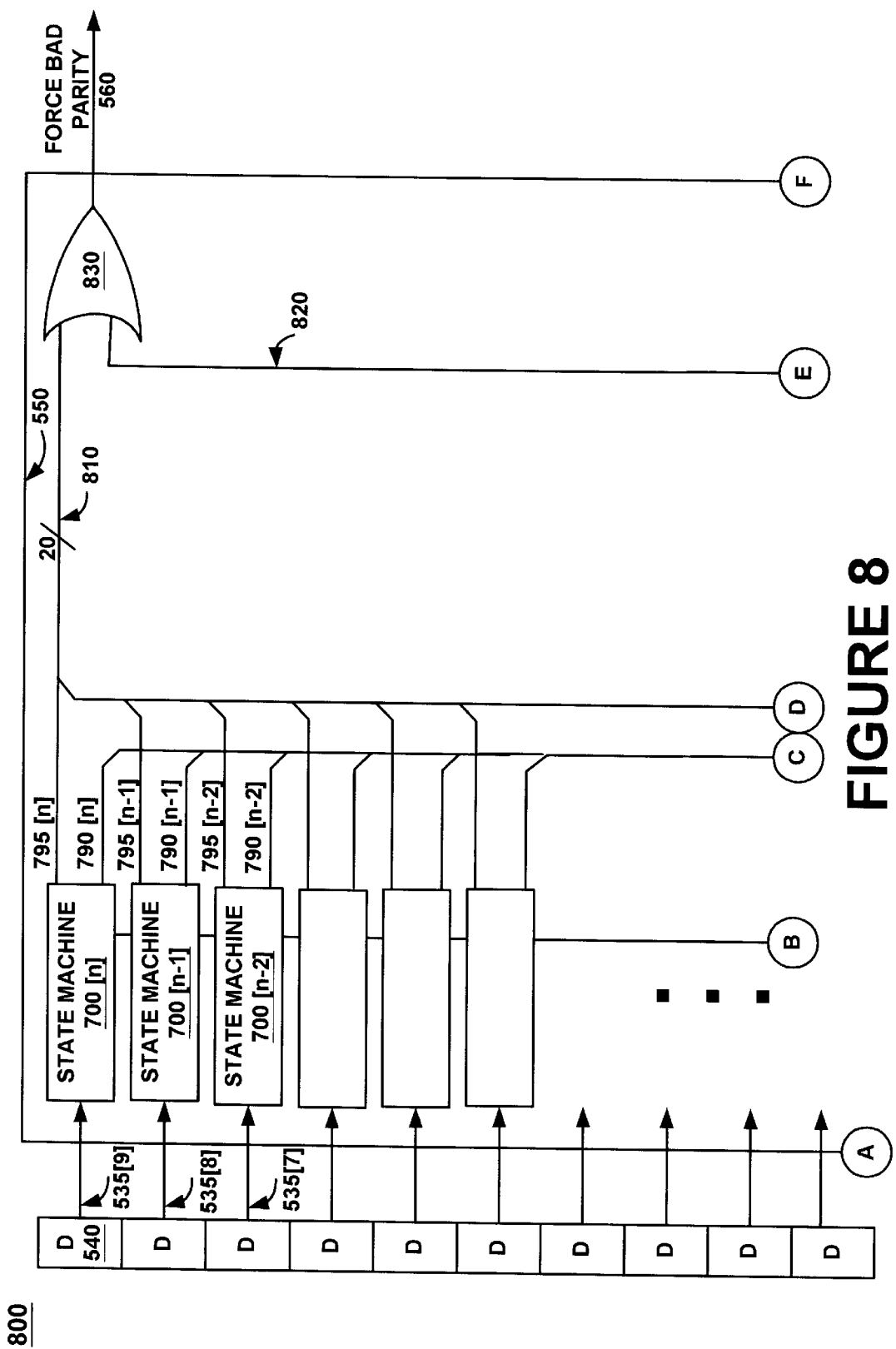
FIG. 8 is a block diagram of the Distributed Framing Bit Detection logic block, containing the plurality of sequence detection logic blocks and comparator. It is also an exemplary representation of the detection of the framing-bit sequence and reporting the offset of the character boundary.
Figure 8:
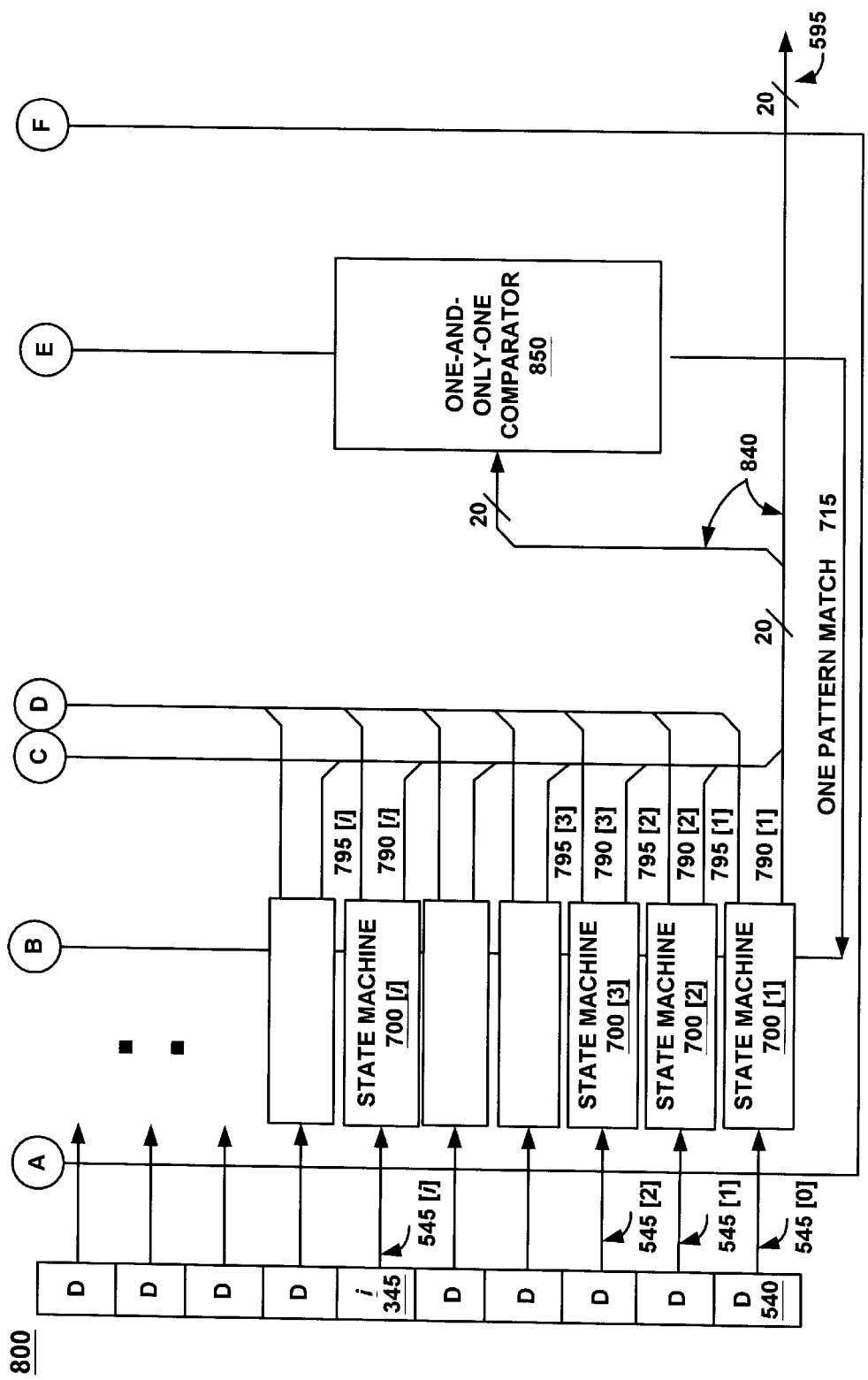

FIG. 7 illustrates a sequence detection state machine 700 which is replicated n+1 times and used in circuit 550 of FIGS. 5 and 8. Circuit 550 therefore contains 20 instances of the sequence detection state machine 700 which determine where the framing bit sequence is located in the received character stream. These instances are all coupled to a comparator which checks if this detection process has resolved down to a single instance matching the selected framing sequence for a predefined number of consecutive characters times. While this predefined number can be set to any value, this count is normally set to between 5 and 12 for the framing bit sequence used in this example. This allows a 4-bit count-field to validate the detection at each interleave position.

State machine 700 consists of three primary sections: a pattern match circuit comprising XOR gate 750 and two history flip-flops 730 and 740, a pattern valid length counter 772, and control logic block 785. To reduce system hardware requirements, all instances of flip-flop 730 may exist as part of the pipeline register 596 in FIG. 5. The input to logic block 700 is the signal 710 associated with one bit position of the possible 20-bits latched in the pipeline registers 530 and 540. The outputs of logic block 700 are a Sequence Match signal 790, and a Miscompare Parity Error signal 795. Circuit 700 is designed to generate an asserted output over Match Status signal 770 whenever its input 710 is validated as matching the framing pattern, e.g., 001100110011 . . . . Circuit 700 is also designed to generate an asserted output over the a Miscompare Parity Error signal 795 when a pattern match has been resolved to this specific instance off state machine 700 (as indicated by both Sequence Match signal 790 and One Pattern Match signal 715 being asserted), and a bit in the framing sequence is reported as not matching the selected framing bit sequence (as indicated by Match Status signal 770 being not asserted).

The pattern match circuit in sequence detection state machine 700 responds to a single bit in each character clock period. The two history flip-flops 730 and 740 are used to store the state of the same bit position within each (n+1) bit character from the preceding two character clock periods. The data input signal 710 of the present character is coupled to one input of XOR gate 750, while the output of second history flip-flop 740 presents signal 760 to the second input of XOR gate 750. When both inputs to XOR gate 750 are non-equal, a pattern match has been identified for a period of one character, and is indicated by an asserted state on Match Status signal 770. Data input signal 710 is also coupled to the data input of first history flip-flop 730, which captures the value of the signal 710 once per character time. The output signal 720 of first history flip-flop 730 is coupled to the data input of second history flip-flop 740, which captures the value of the signal 720 once per character time.

A known characteristic of the example framing bit sequence is that it repeats within a short history and requires few hardware resources to validate its presence. Alternate patterns or sequences may require significantly more or less hardware to validate detection of the selected pattern or sequence.

The Match Status signal 770, generated by said pattern match circuit, is directly coupled to an input of control logic block 785. This control logic block also responds to the state of the comparator as presented on the One Pattern Match signal 715. The control logic block uses the state of these two inputs, along with the state of the associated pattern valid length counter 772, to present the Miscompare Parity Error signal 795 and Sequence Match signal 790 to the comparator logic.

An associated pattern valid length counter 772 may then be used to determine if this Match Status signal remains asserted over a predetermined number of consecutive characters. Counter 772 is coupled directly to the control logic block 785 which directs counter 772 to count up, count down, or reset. The counter presents a terminal count status to the control logic block.

When Match Status 770 is asserted and the One Pattern Match signal 715 from the comparator is not asserted (indicating that framing has not yet been found), the control logic block 785 asserts output 774 which directs counter 772 to advance by one count. When Match Status 770 is not asserted and the One Pattern Match signal 715 from the comparator is also not asserted, the control logic block 785 asserts output 778 which directs the counter 772 to reset.

If the pattern valid length counter 772 ever reaches its predefined maximum count value, it asserts a Terminal signal 780 to control logic block 785. Upon receiving Terminal signal 780 asserted, control logic block 785 asserts its Sequence Match signal 790 to the comparator. Once sequence Sequence Match signal 790 is asserted, the control logic block continues to monitor the state of Match Status signal 770 and One Pattern Match signal 715. Until signal One Pattern Match 790 is received asserted from the comparator, a single miscompare from the pattern match circuit (indicated by a deasserted state on Match Status signal 770) will cause the control logic block to assert the Reset signal 778 to the counter, and deassert the Sequence Match signal 790.

Once the comparator determines that only one instance of the state machine 700 is reporting a Sequence Match, it asserts the One Pattern Match signal 715 to all instances of the state machine. This is done both to prevent additional state machines from reporting a Sequence Match, and to allow the control logic block 785 to change from detection to error handling mode.

With signal One Pattern Match 715 asserted, the control logic block 785 responds in two different modes. For those instances of the state machine that have not reported a Sequence Match, the counter continues to operate as before, such that a valid Match Status signal 770 directs the counter to count up, while any mismatch directs the counter 772 to reset. If any counter reaches its Terminal count, it remains at that value and asserts its Terminal signal 780 to the control logic block 785, but the control logic block is prohibited from asserting its Sequence Match signal 780.

For the one instance of the sequence detection state machine that has validated detection of the framing sequence (as indicated by the assertion of its Sequence Match signal 790 output and reception of the One Pattern Match signal 715 from the comparator in the asserted state), the control logic block is now configured for error handling. This mode exists to allow the presence of limited errors in the framing sequence (as might occur normally on a serial communications link) without forcing the immediate loss of framing.

In this error handling mode, the reception of a mismatch in the framing sequence (as indicated by the Match Status signal 770 being deasserted to the control logic block 785) causes the Miscompare Parity Error signal 795 to be asserted for the character time where the error is present. If the Match Status signal is asserted during the following character time (indicating a valid compare) the Miscompare Parity Error signal 795 is deasserted.

For the sequence detection state machine instance that has valid detection of the framing sequence, the presence of errors in the framing sequence are also tracked by the pattern valid length counter 772. In this state, the detection of a mismatch in the framing sequence generates a count down signal 776 to the pattern valid length counter. This causes the counter to deassert its Terminal signal 780. All following match and mismatch statuses presented on the Match Status signal 770 cause respective count up 774 or count down 776 signals to be presented to the counter. If the counter reaches its terminal count following an associated count up signal, it again asserts Terminal 780 to the control logic block 790. If the counter reaches its reset value following an associated count down signal, it also asserts Terminal 790. If the control logic block 785 detects Terminal 780 asserted immediately following an associated count down signal (as generated by the detected mismatch), the Sequence Match signal 790 is deasserted to the comparator. This causes an immediate loss of framing, and the comparator deasserts the One Pattern Match signal 715.

FIG. 8 illustrates twenty copies of sequence detection state machine 700 of FIG. 7 inside the (DFBDL) block 550 of FIG. 5. Because the framing-bit-sequence can exist at any one of 20 possible bit-locations, the sequence must be examined at all 20 locations of the pipeline registers 530 and 540. This requires 20 copies of the sequence detection state machine. Each one of the sequence detection state machines 700 of FIG. 7 examines if one bit location within the 20-bits of two 10-bit groups 535 and 545 of FIG. 5 as received from pipeline registers 530 and 540. Framing bits 345 ($i$) of FIGS. 3A and 3B may exist in consecutive characters at any one of these 20 possible bit-locations.

A comparator 850 (of FIG. 8) receives all of the Sequence Match outputs 840 of the n+1 instances of state machine 700. When a sequence detection logic block 700$i$ detects the framing pattern as being valid over a predetermined number of characters, its corresponding Sequence Match output signal 790 is asserted within bus 840. When the comparator 850 receives one asserted signal and n de-asserted signals, then it determines the location of the frame marker based on the matching state machine. The comparator will not indicate a valid frame detection unless one-and-only-one sequence detection state machine 700 indicates detection of a sequence match. This comparator can be implemented in a number of ways, but is generally a gating structure consisting of 20 product terms (each a 20 input AND gate) all ORed together. This information is then supplied to the barrel shifter (over 20 bit bus 595), e.g., using one hot encoding. Barrel shifter 570 receives the location of frame marker in form of a vector address.

The output of the comparator 850 and all instances of the sequence detection state machine 700 are also used to drive the parity control signal (to force bad parity). When the comparator 850 has not resolved the Sequence Match bus 840 to a single sequence match location, it asserts a signal 820 to an input of OR-gate 830. When any input to OR-gate 830 is asserted, it asserts the Force Bad Parity signal 560 which controls the data presented from the output register 580. If Force Bad Parity signal 560 is asserted, the content of output register 580 is ignored, and output data 590 is presented having invalid parity.

When the comparator has resolved the Sequence Match bus 840 to a single (i.e., one-and-only-one) sequence detection state machine having Sequence Match asserted, then signal 820 remains deasserted. With signal 820 deasserted, parity errors are forced only by the single sequence detection state machine 700 with its associated Sequence Match 790 signal asserted. While the Miscompare Parity Error outputs 810 of all instances of the sequence detection state machine are connected to inputs of OR-gate 830, only the one instance reporting a Sequence Match is allowed to assert its associated Miscompare Parity Error output signal 795.

As shown in FIG. 5, Barrel shifter 570 looks across a 38-bit input (bus 566; bus 567; and bus 568) and selects the proper group of 19 bits out of the 38 bit input. Pipeline registers 530 and 540 supply the current 20 bits-while pipeline register 596 supplies the previous 20 bits from the prior character clock cycle. Output register 580 receives a 19-bit subset of the 38-bit input that corresponds to character-aligned data, without the frame marker bit, and recaptures data character 310.

Figure 9:
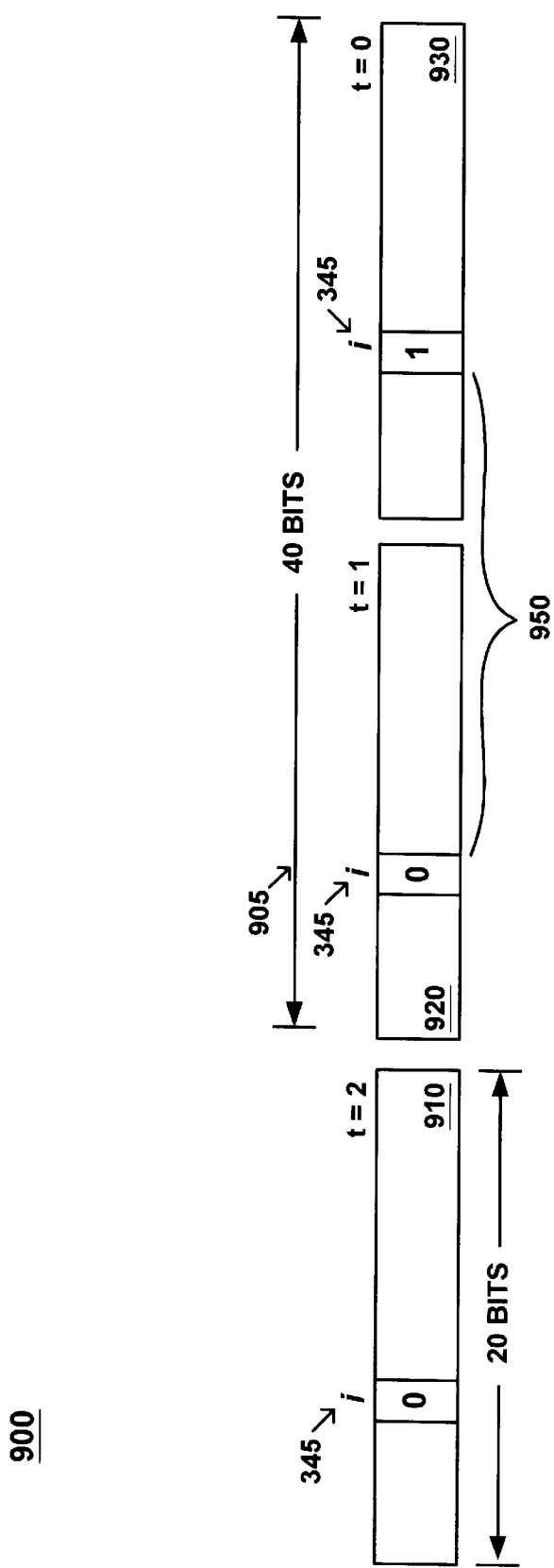
FIG. 9 is an exemplary depiction of removing the frame marker and recapturing the transmitted data characters as performed by the receiver.

FIG. 9 depicts removal of the framing bits and capturing of the data characters. As discussed, in one embodiment of the present invention, a one-bit frame marker is added in the same bit location to each of the 19-bit data characters received from a data source. The one-bit frame marker follows a framing sequence pattern. The DFBDL block determines the location, i, of the bit interleaved frame marker bits 345 and passes a vector indicating the data character offset position to barrel shifter 570 of FIG. 5. Barrel shifter 570 of FIG. 5 looks across a 40-bit section of data stream 905, (including a subsection of 930 at t=0 and a subsection of 920 at t=1), and removes the proper n-bit section, which is the aligned data character. Barrel shifter 570 of FIG. 5 then multiplexes that data character 950 and sends it to the output register 580 of FIG. 5 where it is recaptured and presented as 310.

It is appreciated that bit-interleaved framing presented by this invention is not limited to 19-bit data characters, but rather data characters may be of any character width used in the telecommunication and data communications industries, for instance. Also, the number of bits in the framing sequence pattern may be of any number, and are typically validated over a span of between 5 and 12 characters, in one embodiment. It is appreciated that the validation of the framing sequence pattern is not limited to a range of between 5–12 characters, and the larger the number of bits in the framing sequence pattern the greater the validity of boundary detection.

Thus, the present invention provides a method and system to serially transmit data characters with bit-interleaved framing, eliminating gaps in the stream of data character during transmission. The present invention allows reduction of the number of links required on the backplane for transferring data characters by serial transmission of data over a single channel, e.g., a differential pair. Furthermore, the present invention reduces inter symbol interference and eliminates the requirement for D-C coupling by encoding the data characters. Also, the present invention serial transmission can be either AC- or DC-coupled allowing transmission using optical links, balanced or unbalanced transmission lines, or circuit board transmission-line constructs.

The foregoing descriptions of specific embodiments of the present invention have been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A communication system comprising:
    a transmission device for receiving n-bit characters at a first character rate and for supplying a serial transmission of framing information bit interleaved with data characters at a second bit rate, said second bit rate being faster than said first character rate; and
    a receiving device for receiving said serial transmission of framing information bit interleaved with data characters over a single serial transmission link and for simultaneously examining (n+1) possible bit positions to locate framing bits within a bit location therein and thereafter for recapturing said n-bit characters.

2. A communication system as described in claim 1 wherein said receiving device comprises framing bit detection logic comprising a plurality of circuits, each for simultaneously examining a respective position of said (n+1) bits for a predetermined framing sequence and for signaling a match thereof.

3. A communication system as described in claim 2 wherein said receiving device further comprises a comparator circuit coupled to said plurality of circuits for determining said bit location of said framing bit and otherwise for signaling invalid framing.

4. A communication system as described in claim 3 wherein said invalid framing is reported as invalid data.

5. A communication system as described in claim 3 wherein said comparator circuit determines said bit location by locating a one-and-only-one framing match.

6. A communication system as described in claim 2 wherein said receiving device further comprises a character alignment circuit for recapturing said n-bit characters based on said bit location of said framing bit and said character alignment circuit coupled to said comparator circuit.

7. A communication system as described in claim 1 wherein said second bit rate is more than 1 Gbit/second.

8. A communication system as described in claim 1 wherein said first character rate is 70 MHz.

9. A communication method comprising:
    a) receiving a data stream of n-bit characters at a transmitting device;
    b) adding a respective single bit frame marker to each of said n-bit characters to demark character boundaries using bit interleaved framing;
    c) transmitting said plurality of n-bit characters and said single bit frame markers over a single serial communication link using a serial transmission wherein framing bits are interleaved between said characters, said transmission done at a transmission bit rate;
    d) capturing said plurality of n-bit characters serially transmitted by said transmitting device; and
    e) determining framing by examining (n+1) possible bit locations simultaneously to locate a position of said frame markers interleaved between said n-bit characters of said transmission and recovering said plurality of n-bit characters thereafter.

10. The method as recited in claim 9, wherein said n-bit data characters are 19-bit characters.

11. The method as recited in claim 9, wherein said single bit frame markers follow a pre-determined framing sequence.

12. The method as recited in claim 11, wherein said pre-determined framing sequence is 001100110011.

13. The method as recited in claim 9, wherein said transmission bit rate is at least 1 Gbit/second.

14. The method as recited in claim 13 wherein said transmission is continuous data without gaps.

15. A communication device for transmitting a serial output of framing information bit interleaved with a plurality of n-bit data characters, said device comprising:
    a framing bit generator for generating a single bit frame marker in accordance with a predefined framing sequence;
    a scrambler for producing a scrambled (n+1)-bit data by combining said single bit frame marker with each n-bit data character received to generate a combined result and merging said combined result with a scrambler polynomial;
    an encoder for encoding said scrambled (n+1)-bit data;
    a serializer for serializing an output of said encoder to produce said serial output which is transmitted over a single serial communication link at a transmission rate 1 Gbit/second or more.

16. A device of claim 15 wherein said n-bit data character is a 19-bit character.

17. A device of claim 15 wherein said predefined framing sequence is . . . 0011001100110011 . . . .

18. A device of claim 15 wherein said scrambler is an SMPTE scrambler.

19. A device of claim 15 wherein said encoder is an NRZI encoder.

20. A receiving device for receiving a serial stream of bits comprising:
    a deserializer for deserializing said serial stream of bits into first parallel data groups comprising bit frame markers and n-bit data characters;
    a decoder for decoding said first parallel data groups into second parallel data groups;
    a descrambler for descrambling said second parallel data groups into third parallel data groups;
    a pipeline register for latching two consecutive data groups;
    framing detection logic coupled to a portion of said pipeline register for simultaneously examining (n+1) bits of multiple data groups to determine a bit location of said frame markers; and a character extracter, coupled to said framing detection logic and said pipeline register, for supplying recaptured n-bit characters based on said bit location of said frame markers.

21. A receiving device as described in claim 20 wherein said framing detection logic comprises:

a plurality of sequence detection logic blocks respectively coupled to each bit of said portion of said pipeline register, each for simultaneously detecting said frame markers at a respective bit position; and a comparator for comparing outputs of said plurality of sequence detection logic blocks for a one-and-only-one framing match to determine said bit location of said frame marker which is signaled over a bus output.

22. A receiving device as described in claim 21 wherein said character extractor is a barrel shifter coupled to said pipeline registers and receiving said bus output of said comparator.

23. A receiving device as described in claim 20 further comprising an n-bit output register for capturing said n-bit data characters from said character extractor.

24. A receiving device of claim 21 wherein each of said sequence detection logic blocks comprise XOR gates.

25. A receiving device of claim 20 wherein said character extractor operates at a character rate of 70 MHz or greater.

* * * * *